(12) United States Patent
Ramalingam et al.

(10) Patent No.: US 9,704,767 B1
(45) Date of Patent: Jul. 11, 2017

(54) MOLD COMPOUND WITH REINFORCED FIBERS

(71) Applicant: Intel Corporation, Santa Clara, CA (US)

(72) Inventors: Suriyakala Ramalingam, Chandler, AZ (US); Yiqun Bai, Chandler, AZ (US); Nisha Ananthakrishnan, Chandler, AZ (US); Arjun Krishnan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/998,368

(22) Filed: Dec. 23, 2015

(51) Int. Cl.
| | |
|---|---|
| *H01L 23/29* | (2006.01) |
| *H01L 21/56* | (2006.01) |
| *H01L 23/16* | (2006.01) |
| *H01L 23/498* | (2006.01) |
| *H01L 21/48* | (2006.01) |

(52) U.S. Cl.
CPC .......... *H01L 23/16* (2013.01); *H01L 21/4853* (2013.01); *H01L 21/565* (2013.01); *H01L 23/295* (2013.01); *H01L 23/49811* (2013.01)

(58) Field of Classification Search
CPC . H01L 2924/01079; H01L 2924/01078; H01L 2924/15311; H01L 23/16; H01L 23/29; H01L 23/295; H01L 23/49; H01L 23/498; H01L 23/4981; H01L 23/49811; H01L 21/48; H01L 21/485; H01L 21/4853; H01L 21/56; H01L 21/565
USPC ...................................................... 257/730
See application file for complete search history.

(56) References Cited

U.S. PATENT DOCUMENTS

| | | | |
|---|---|---|---|
| 6,632,704 B2 | 10/2003 | Kumamoto et al. | |
| 7,294,533 B2 | 11/2007 | Lebonheur et al. | |
| 2002/0110956 A1 | 8/2002 | Kumamoto et al. | |
| 2003/0045628 A1 | 3/2003 | Konayagi et al. | |
| 2006/0226525 A1* | 10/2006 | Osuga ................. | H01L 23/3128 257/685 |
| 2008/0131702 A1 | 6/2008 | Bae et al. | |
| 2011/0260342 A1 | 10/2011 | Tsukurimichi | |
| 2012/0074596 A1 | 3/2012 | Sumita et al. | |
| 2012/0280425 A1 | 11/2012 | Nishikawa | |

(Continued)

OTHER PUBLICATIONS

International Search Report and Written Opinion for PCT Patent Application No. PCT/US16/56663 mailed Jan. 25, 2017, 13 pgs.

*Primary Examiner* — Monica D Harrison
(74) *Attorney, Agent, or Firm* — Blakely, Sokoloff, Taylor & Zafman LLP

(57) ABSTRACT

Techniques and mechanisms for mitigating warpage of structures in a package. In an embodiment, a packaged integrated circuit device includes a mold compound disposed at least partially around an integrated circuit chip. The mold compound comprises fibers suspended in a media that is to aid in mechanical reinforcement of such fibers. The reinforced fibers contribute to mold compound properties that resist warping of the IC chip that might otherwise take place as a result of solder reflow or other processing. A modulus of elasticity of the mold compound is equal to or more than three GigePascals (3 GPa), where the modulus of elasticity corresponds to a temperature equal to two hundred and sixty degrees Celsius (260° C.). In another embodiment, a spiral flow value of the mold compound is equal to or more than sixty five centimeters (65 cm).

20 Claims, 7 Drawing Sheets

(56) References Cited

U.S. PATENT DOCUMENTS

2012/0319304 A1* 12/2012 Pressel ..................... B81B 7/02
  257/787
2014/0210111 A1   7/2014 Chung
2015/0021763 A1   1/2015 Na et al.

* cited by examiner

| Example | 1 | 2 | 3 |
|---|---|---|---|
| Compound type | Glass A/Silica (20/80) | Glass B/Silica (20/80) | Carbon/Silica (30/70) |
| Spiral Flow (cm) | 146 | 108 | 69 |
| CTE @ 25°C (Ppm/°C) | 19 | 16 | 5 |
| CTE @ 260°C (Ppm/°C) | 27 | 21 | 9 |
| Tg (°C) | 186 | 191 | 203 |
| E1 @ 25°C (GPa) | 14 | 15 | 24 |
| E2 @ 260°C (GPa) | 3.1 | 4.5 | 5.8 |

Table 400

FIG. 4

MOLD COMPOUND WITH REINFORCED FIBERS

BACKGROUND

1. Technical Field

Embodiments of the invention relate generally to packaged integrated circuit devices and more particularly, but not exclusively, to mold compounds that mitigate warping in a package.

2. Background Art

Ultra-thin cores and coreless designs, which significantly reduce the vertical (z-height) profile of integrated circuit packages, are increasingly used in tablets and other mobile devices. Warpage is one significant challenge to the manufacture of these types of integrated circuit packages. Typically, stringent warpage specs are imposed so that ball-attach (BA), surface mount technology (SMT) or other assembly processing can be performed successfully.

Stiffener structures are sometimes added to a substrate to mitigate the possibility of warpage. However, the uses of such stiffeners can complicate processing or otherwise lead to increased costs. Moreover, such warpage mitigation is usually limited by properties of an adhesive which is used to bond the stiffener. Other techniques to mitigate warpages, such as over-molding or a molded underfill, are becoming less effective as successive generations of manufacturing technology continue to scale toward thinner packages. Therefore, there is an increasing demand for improved solutions to mitigate package warping, where such solutions can be applied to very thin package designs.

BRIEF DESCRIPTION OF THE DRAWINGS

The various embodiments of the present invention are illustrated by way of example, and not by way of limitation, in the figures of the accompanying drawings and in which:

FIG. 4 is a table showing respective features of various mold compounds each according to a corresponding embodiment.

DETAILED DESCRIPTION

Figure 2:
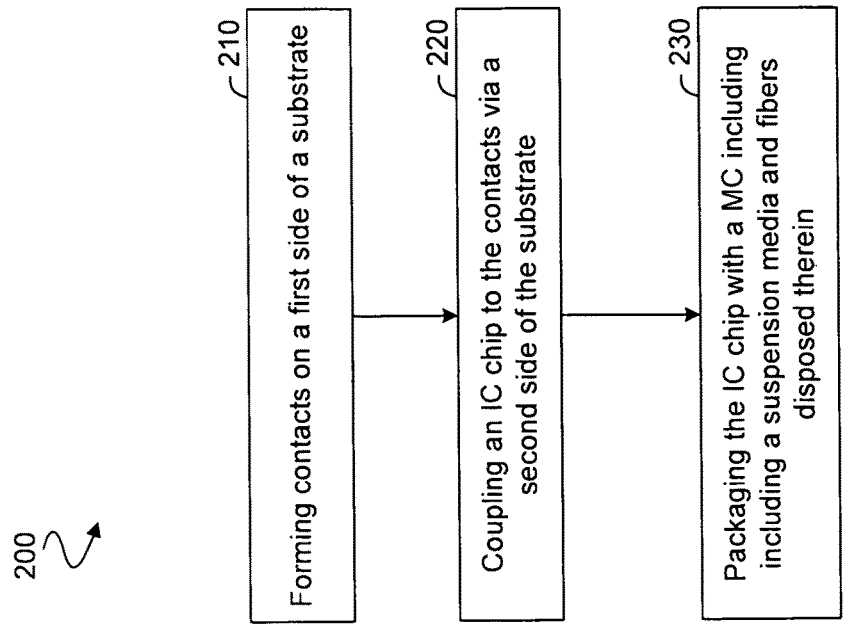
FIG. 2 is a flow diagram illustrating elements of a method of manufacturing a packaged device according to an embodiment.

Embodiments discussed herein variously include techniques or mechanisms to reduce warpage of a packaged device with a mold compound (MC) that provides improved mechanical properties. A MC according to one embodiment includes fibers—e.g., including glass fibers, carbon fibers and/or Kevlar fibers—that aid in the MC having a high modulus, high spin flow and/or any of a variety of one or more other characteristics. Such characteristics may mitigate warpage of an integrated circuit (IC) chip and/or a substrate coupled to the IC chip. The substrate—e.g., comprising any of a variety of thin core or coreless structures—may include one or more layers of an insulator material and interconnect structures disposed therein. The interconnect structures may provide for coupling of the IC chip to conductive contacts (such as pads, bumps or other such structures) that are disposed on an opposite side of the substrate. Fibers of an MC may serve as a substitute, at least in part, for any of a variety of one or more conventional mold materials, such as a silica, which are non-fibrous. In some embodiments, one or more characteristics aid in deposition and/or other processing of the mold compound.

An MC according to an embodiment may include one or more other materials in which fibers of the MC are suspended. For brevity, such one or more other materials are referred to herein as a "suspension media." In one illustrative embodiment, a suspension media includes an epoxy resin. Prior to and/or during packaging with such an MC, a suspension media may have fluid characteristics. Subsequently (e.g., after a curing of the MC), such a suspension media may form a solid with fibers of the MC. A suspension material may function as a binder to mechanically and/or chemically aid the fibers in the formation of support structures within a package mold. For example, a suspension material may reinforce the shapes of fibers in the MC.

The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices including a package comprising an at least partially fibrous mold compound.

Figure 1:
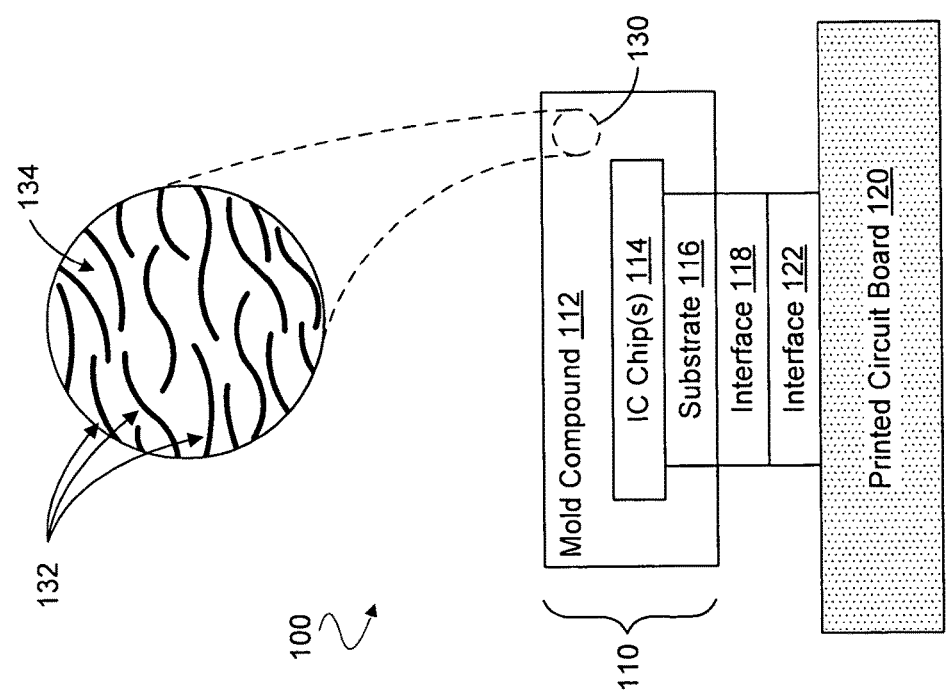
FIG. 1 is a cross-sectional diagram illustrating elements of a system including a packaged integrated circuit device according to an embodiment.

FIG. 1 shows features of a system 100 including a package material according to an embodiment. System 100 may include, or function as a component of, a computer (e.g., a server, desktop computer, laptop computer, tablet or the like), smart phone or any of a variety of other hardware platforms including a packaged IC device.

In the illustrative embodiment shown, system 100 includes a packaged device 110 comprising one or more IC chips (as represented by the illustrative IC chip 114), an interface 118 and a substrate 116 coupling the one or more IC chips to interface 118. IC chip 114 may include a system-on-chip (SoC) or any of various other circuitry comprising processor logic, memory logic, controller logic and/or the like. In some embodiments, packaged device 110 comprises one or more additional and/or different IC chips.

IC chip 114 and interface 118 may be variously coupled, directly or indirectly, on opposite sides of substrate 116. Interface 118 may include input/output (I/O) contacts (e.g., including conductive pads, bumps, pins and/or other such structures) to enable access to IC chip 114 via substrate 116. Substrate 116 may include one or more layers of an insulation material and interconnect structures—e.g., including conductive vias, traces and/or the like—disposed therein. Such interconnect structures may aid in providing access to IC chip 114 via interface 118. By way of illustration and not limitation, substrate 110 may include a laminate core or, alternatively, a monolithic core—e.g., where substrate 110 includes a thin core. Although some embodiments are not limited in this regard, substrate 110 includes structures adapted from any of various conventional coreless substrate designs.

In an embodiment, a package material of device 110 includes a mold compound (MC) 112 disposed on—e.g., around—one or both of IC chip 114 and substrate 116. MC 112 may include fibers that, during manufacture of packaged device 110, aid in mitigating warpage of IC chip 114. For example, MC 112 may include a media 134 and fibers 132 suspended therein (as illustrated in the detail view of a region 130). Fibers 132 may include any of a variety of materials that contribute to an increased modulus of elasticity of MC 112. By way of illustration and not limitation, fibers 132 may include one or more of glass fibers, carbon fibers and/or fibers of any of a variety of synthetic materials such as Kevlar® from E. I. du Pont de Nemours and Company of Wilmington, Del., USA. In some embodiments, a proportion of fibers 132—e.g., in relation to media 134—contributes to spin flow characteristics that facilitate good processability of MC 112 during packaging of IC chip 114 and/or substrate 116.

Although some embodiments are not limited in this regard, system 100 may further include, or couple to, a support structure for packaged device 110, such as the illustrative printed circuit board 120. Printed circuit board 120 may aid in coupling of packaged device 110—e.g., via I/O contacts of an interface 122—to hardware, software, a user interface and/or any of various other such mechanisms (not shown) that are included in, or are to couple to, system 100.

FIG. 2 shows features of a method 200 for producing a packaged circuit device according to an embodiment. Method 200 may produce a device having some or all of the features of packaged device 110, for example. In an embodiment, method 200 includes, at 210, forming contacts on a first side of a substrate such as substrate 116. For example, interface 118 may include some or all of the contacts formed at 210. Method 200 may further comprise, at 220, coupling an integrated circuit (IC) chip to the contacts via a second side of the substrate—e.g., where the second side is opposite the first side. In one embodiment, the forming at 210 and the coupling at 220 includes semiconductor processing (such as one or more mask, photolithography, etch, metal deposition and/or other fabrication operations) adapted from conventional techniques for building a substrate and I/O contacts, directly or indirectly, on one or more IC chips. Some embodiments are not limited with respect to such techniques, which are not detailed herein to avoid obscuring certain features of various embodiments.

Method 200 may further comprise, at 230, packaging the IC chip with a mold compound including a suspension media and fibers disposed therein. The packaging at 230 may be performed after the coupling at 220, for example. In an embodiment, the packaging at 230 includes disposing the mold compound at least partially around the IC chip—e.g., using operations adapted from any of a wide range of conventional encapsulation techniques such as resin transfer molding, sheet molding and/or the like.

Some or all of the suspension media may be adapted from any of a wide range of conventional package materials. Examples of such materials include, but are not limited to, an epoxy resin and/or any of various filler materials such as a silica, thermally conductive aluminum nitride (AlN) and boron nitride (BN) and/or other additives such as mold release agents, surfactants, etc. Some or all fibers of the mold compound may provide for an increased spiral flow and/or other improved characteristics. For example, fibers of the mold compound may include a carbon material, a glass, Kevlar, or any of various other materials that have a relatively high modulus of elasticity—e.g., as compared to a corresponding modulus of the suspension media.

Characteristics of a mold compound may be attributable at least in part to one or more dimensions of the fibers therein. For example, fibers of a mold compound may have an average cross-sectional width (e.g., a diameter) in a range from 0.1 micrometers (μm) to 100 μm. Alternatively or in addition, such fibers may have an average length (e.g., orthogonal to a cross-section) that is at least 0.5 μm. In one illustrative embodiment, a ratio of an average fiber width to an average fiber length is equal to five (5) or more—e.g., where such a ratio is equal to ten (10) or more. However, such fiber dimensions may vary widely according to implementation-specific details, and may not be limiting on some embodiments.

In some embodiments, a fractional proportion of fibers in the mold compound may contribute to spiral flow and/or other mechanical properties that provide for improved processability. By way of illustration and not a limitation, fibers may comprise 35% or less (e.g., no more than 30%) by weight of a mold compound. Such fibers may comprise, for example, no more than 20% by weight (and, in some embodiments, no more than 15%) of the mold compound. In some embodiments, a mold compound comprises no more than 5% fibers by weight.

Based on characteristics such as a fiber material, fiber dimensions and/or fractional proportion of fibers, a mold compound according to some embodiments may exhibit a high spiral flow characteristics. As used herein, "spiral flow" (or "spiral flow value") refers to a flow property of a material, as measured according to the Standard Test Method for Spiral Flow of Low-Pressure Thermosetting Molding Compounds, ASTM D3123-09, released in 2009 by the American Society of the International Association for Testing and Materials (ASTM) of West Conshohocken, Pa. In one illustrative embodiment, a spiral flow of the mold compound may be equal to or more than 65 centimeters (cm)—e.g., where the spiral flow is 80 cm or more. For example, the spiral flow may be equal to or more than 100 cm (and, in some embodiments, equal to or more than 130 cm).

Alternatively or in addition, the mold compound may exhibit a high modulus of elasticity at a high temperature, such as a solder reflow temperature. In one example embodiment, a mold compound has a modulus of elasticity, at 260° C., that is equal to or more than three GigaPascals (GPa). For example, such a modulus of elasticity may be equal to or more than 4 GPa and, in some embodiments, equal to or more than 5 GPa. Other mechanical properties of a mold compound may aid in fabrication processing and/or mitigate structure warpage during or after such fabrication processing. For example, a mold compound may further exhibit good expansion characteristics at high temperatures. In one embodiment, such a mold compound has a coefficient of thermal expansion (CTE) at 260° C. (or some other solder reflow temperature) that is equal to or more than 5 parts per million per degree Celsius (Ppm/° C.). In some embodiments, such a higher temperature CTE is more than 20 Ppm/° C.—e.g., where the CTE is more than 30 Ppm/° C.

Although some embodiments are not limited in this regard, a mold compound may have a CTE at room temperature (e.g., 25° C.) that is equal to or more than 5 Ppm/° C. In some embodiments, such a room temperature CTE may be more than 10 Ppm/° C. (e.g., where the CTE is more than 15 Ppm/° C.). Alternatively or in addition, a mold compound may have a glass transition temperature that, for example, is in a range of 175° C. to 210° C.

Figure 3:
FIG. 3 shows cross-sectional views of processing to manufacture a packaged integrated circuit device according to an embodiment.
Figure 3:
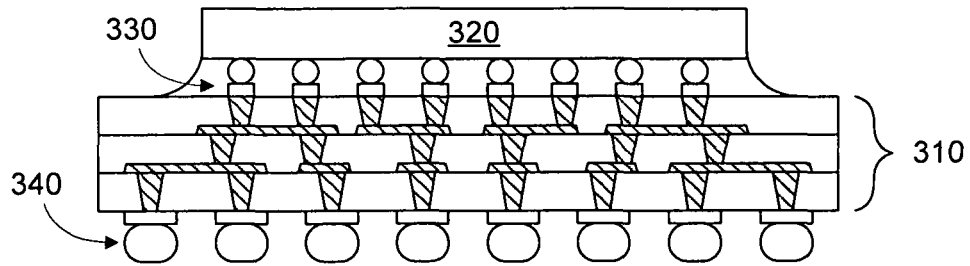
Figure 3:
Figure 3:
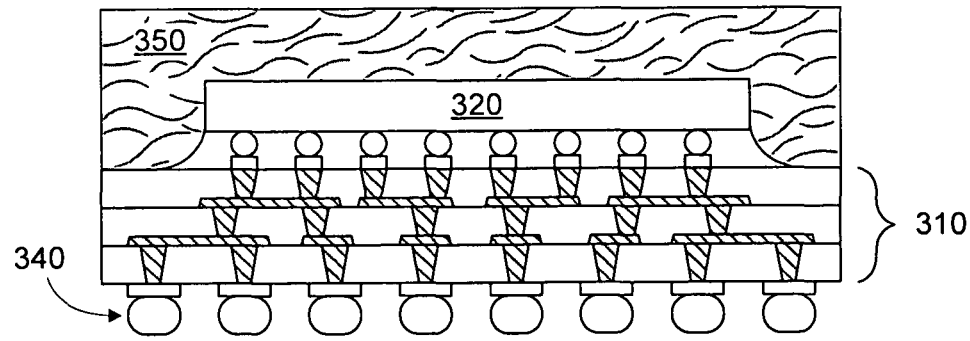

FIG. 3 shows cross-sectional views illustrating respective stages 300, 302 of processing to fabricate a packaged integrated circuit device according to one embodiment. The processing represented in FIG. 3 may include operations of method 200—e.g., where such processing is to fabricate packaged device 100 at least in part.

At stage 300, an IC chip 320 may be bonded to an upper surface of a substrate 310—e.g., by a flip chip process. In an embodiment, substrate 310 includes a thin core or a coreless substrate, comprising layers of interconnections and vias, with one surface having conductive bumps or other contacts for electrical connection to corresponding contacts of IC chip 320. The lower surface of the substrate 310 may comprise or have disposed thereon an array 340 of electrical connects, such as solder balls, serving as input/output electrical connections for the package. While various embodiments are described herein as variously including a thin core or coreless substrate, other embodiments are not limited to such context, i.e., practice of other embodiments may have uses with various types of chips, substrates and/or mounting technologies, e.g., such as a flip chip pin grid array. Although some embodiments are not limited in this regard, an underfill material 330 may dispensed—e.g., at the edges of IC die 320—and allowed to seep to a space between the IC die 320 and substrate 310 by a capillary action.

At stage 302, a mold compound 350 may be disposed at least partially (e.g., in at least two dimensions) around IC chip 320 and/or substrate 310. Deposition of mold compound 350 may include operations adapted from any of various conventional molding techniques such as injection molding, resin transfer molding, sheet molding and/or the like. In an embodiment, mold compound 350 includes fibers that mitigate warping of structures including IC chip 320 and/or substrate 310. For example, such fibers may be suspended in a media of mold compound 350 that, when cured, reinforces such fibers. The fibers may contribute to one or more properties (e.g., spin flow, modulus of elasticity and/or the like) that aid in deposition of the mold compound 350 around IC chip 320 and/or substrate 310. Additionally or alternatively, such one or more mechanical characteristics may resist warpage of IC chip 320 and/or substrate 310 during subsequent solder reflow and/or other processing.

FIG. 4 shows a table 400 listing various characteristics for respective mold compounds each according to a corresponding embodiment. More particularly, table 400 shows, for each of three example mold compounds, a spiral flow value (as measured according to ASTM D3123-09), a CTE corresponding to the mold compound being at a room temperature, another CTE corresponding to the mold compound being at a solder reflow temperature, a glass transition temperature Tg, a modulus of elasticity E1 for the mold compound when at the room temperature, and another modulus of elasticity E2 for the mold compound when at the solder reflow temperature. In the examples represented by table 400, the room temperature is 25° C. and the solder reflow temperature is 260° C. Such examples may include, for example, one or both of mold compounds 112, 350.

The examples 1 and 2 represented in table 400 each include glass fibers and silica in a 20/80 ratio. The example 3 represented in table 400 includes carbon fibers and silica in a 30/70 ratio. The glass fibers of example 2 comprise a glass material that, as compared to that of example 1, have a relatively high modulus of elasticity both at a room temperature (25° C.) and at a solder reflow temperature (260° C.).

As illustrated by table 400, a mold compound may exhibit a combination of characteristics—e.g., where, for each such characteristic, the mold compound is within a respective range of values (such as a range specified herein) and where the combination of characteristics is particularly effective in mitigating warpage and/or in aiding deposition or other processing of the mold compound. By way of illustration and not limitation, a mold compound according to an embodiment may have a spiral flow characteristic that is within one of the ranges (e.g., equal to or more than 65, equal to or more than 100, equal to or more than 130) specified herein, where the mold compound also has a high temperature modulus of elasticity that is within one of the ranges (e.g., equal to or more than 3 GPa, equal to or more than 4 GPa, equal to or more than 5 GPa) specified herein. The mold compound may exhibit any of a variety of additional or alternative combinations of characteristic each within one of various ranges specified herein, according to different embodiments.

Figure 5:
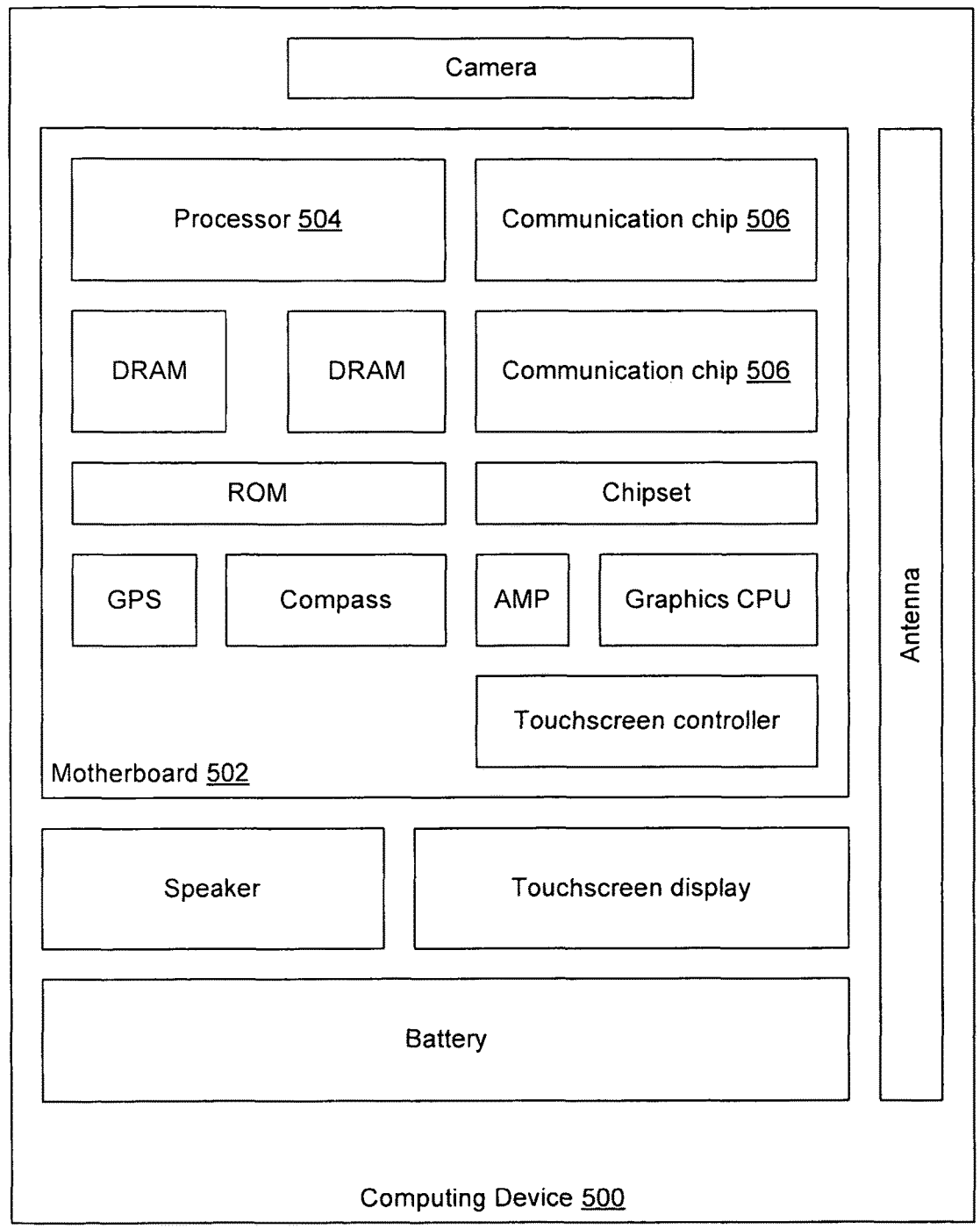
FIG. 5 is a high-level functional block diagram illustrating features of a computing device in accordance with one embodiment.

FIG. 5 illustrates a computing device 500 in accordance with one embodiment. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. The term "processor" may refer to any device or portion of a device that processes electronic data from registers and/or memory to transform that electronic data into other electronic data that may be stored in registers and/or memory. The communication chip 506 also includes an integrated circuit die packaged within the communication chip 506.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Some embodiments may be provided as a computer program product, or software, that may include a machine-readable medium having stored thereon instructions, which may be used to program a computer system (or other electronic devices) to perform a process according to an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 6:
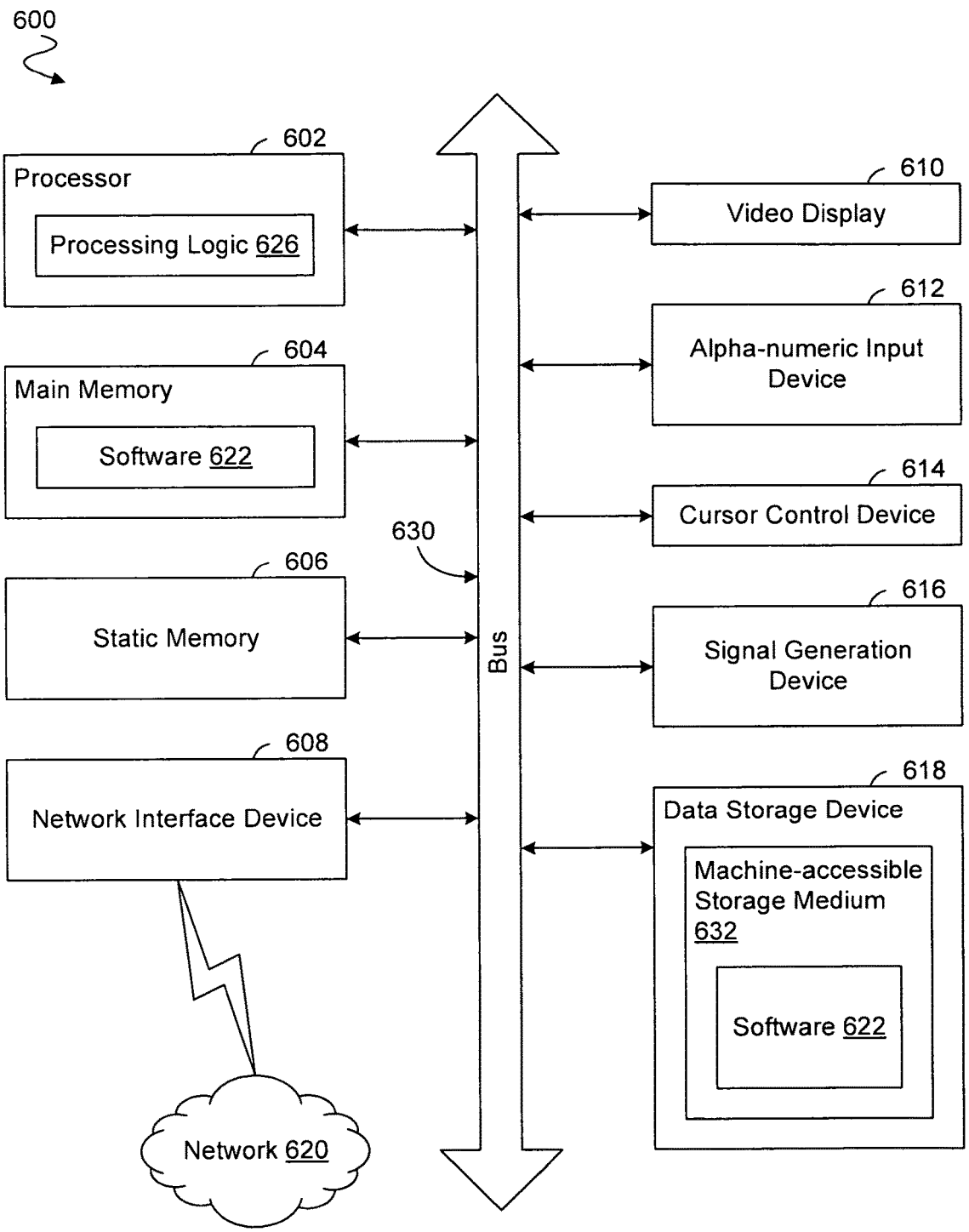
FIG. 6 is a high-level functional block diagram illustrating features of an exemplary computer system, in accordance with one embodiment.

FIG. 6 illustrates a diagrammatic representation of a machine in the exemplary form of a computer system 600 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 600 includes a processor 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a secondary memory 618 (e.g., a data storage device), which communicate with each other via a bus 630.

Processor 602 represents one or more general-purpose processing devices such as a microprocessor, central processing unit, or the like. More particularly, the processor 602 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 602 may also be one or more special-purpose processing devices such as an application specific integrated circuit (ASIC), a field programmable gate array (FPGA), a digital signal processor (DSP), network processor, or the like. Processor 602 is configured to execute the processing logic 626 for performing the operations described herein.

The computer system 600 may further include a network interface device 608. The computer system 600 also may include a video display unit 610 (e.g., a liquid crystal display (LCD), a light emitting diode display (LED), or a cathode ray tube (CRT)), an alphanumeric input device 612 (e.g., a keyboard), a cursor control device 614 (e.g., a mouse), and a signal generation device 616 (e.g., a speaker).

The secondary memory 618 may include a machine-accessible storage medium (or more specifically a computer-readable storage medium) 632 on which is stored one or more sets of instructions (e.g., software 622) embodying any one or more of the methodologies or functions described herein. The software 622 may also reside, completely or at least partially, within the main memory 604 and/or within the processor 602 during execution thereof by the computer system 600, the main memory 604 and the processor 602 also constituting machine-readable storage media. The software 622 may further be transmitted or received over a network 620 via the network interface device 608.

While the machine-accessible storage medium 632 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any of one or more embodiments. The term "machine-readable storage medium" shall accordingly be taken to include, but not be limited to, solid-state memories, and optical and magnetic media.

Figure 7:
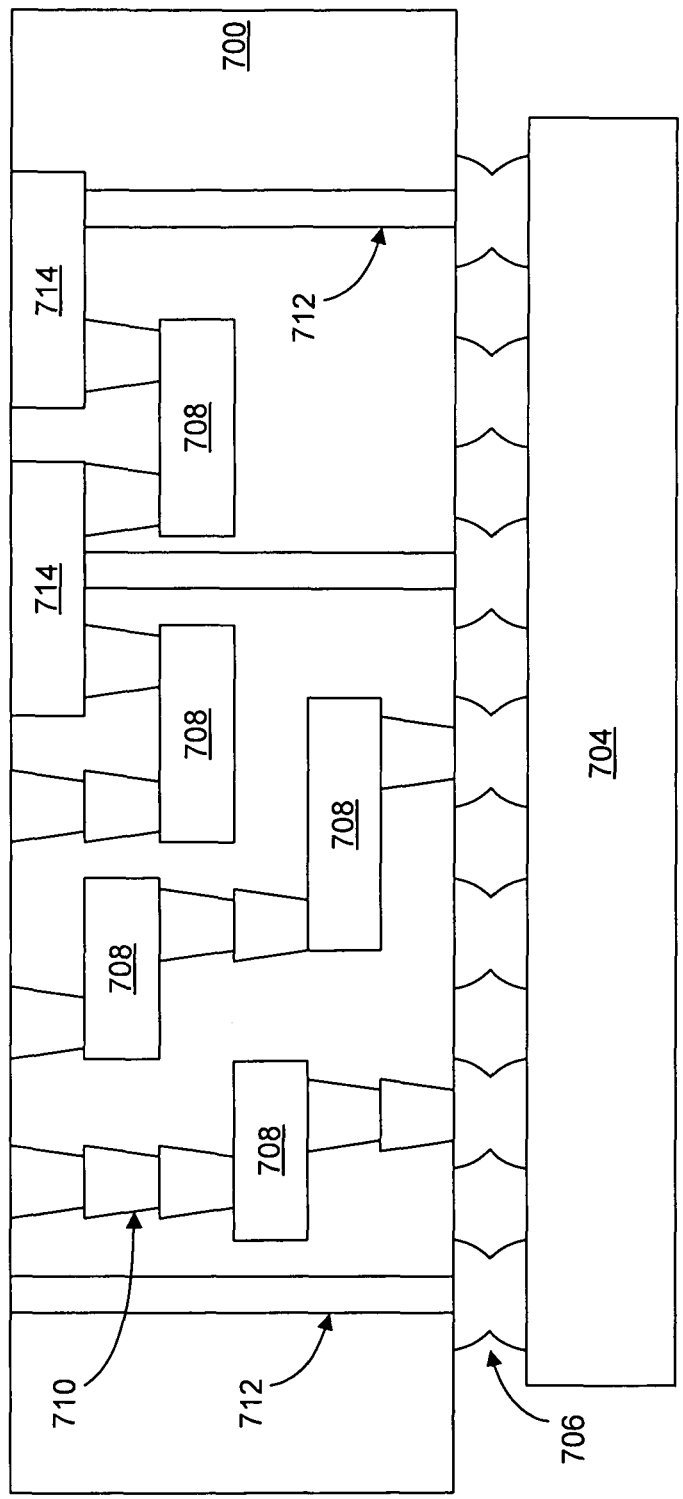
FIG. 7 is an interposer implementing one or more embodiments.

FIG. 7 illustrates an interposer 700 that includes one or more embodiments. The interposer 700 is an intervening substrate used to bridge a first substrate 702 to a second substrate 704. The first substrate 702 may be, for instance, an integrated circuit die. The second substrate 704 may be, for instance, a memory module, a computer motherboard, or another integrated circuit die. Generally, the purpose of an interposer 700 is to spread a connection to a wider pitch or to reroute a connection to a different connection. For example, an interposer 700 may couple an integrated circuit die to a ball grid array (BGA) 706 that can subsequently be coupled to the second substrate 704. In some embodiments, the first and second substrates 702, 704 are attached to opposing sides of the interposer 700. In other embodiments, the first and second substrates 702, 704 are attached to the same side of the interposer 700. And in further embodiments, three or more substrates are interconnected by way of the interposer 700.

The interposer 700 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group and group IV materials.

The interposer may include metal interconnects 708 and vias 710, including but not limited to through-silicon vias (TSVs) 712. The interposer 700 may further include embedded devices 714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 700. In accordance with some embodiments, apparatuses or processes disclosed herein may be used in the fabrication of interposer 700.

Figure 8:
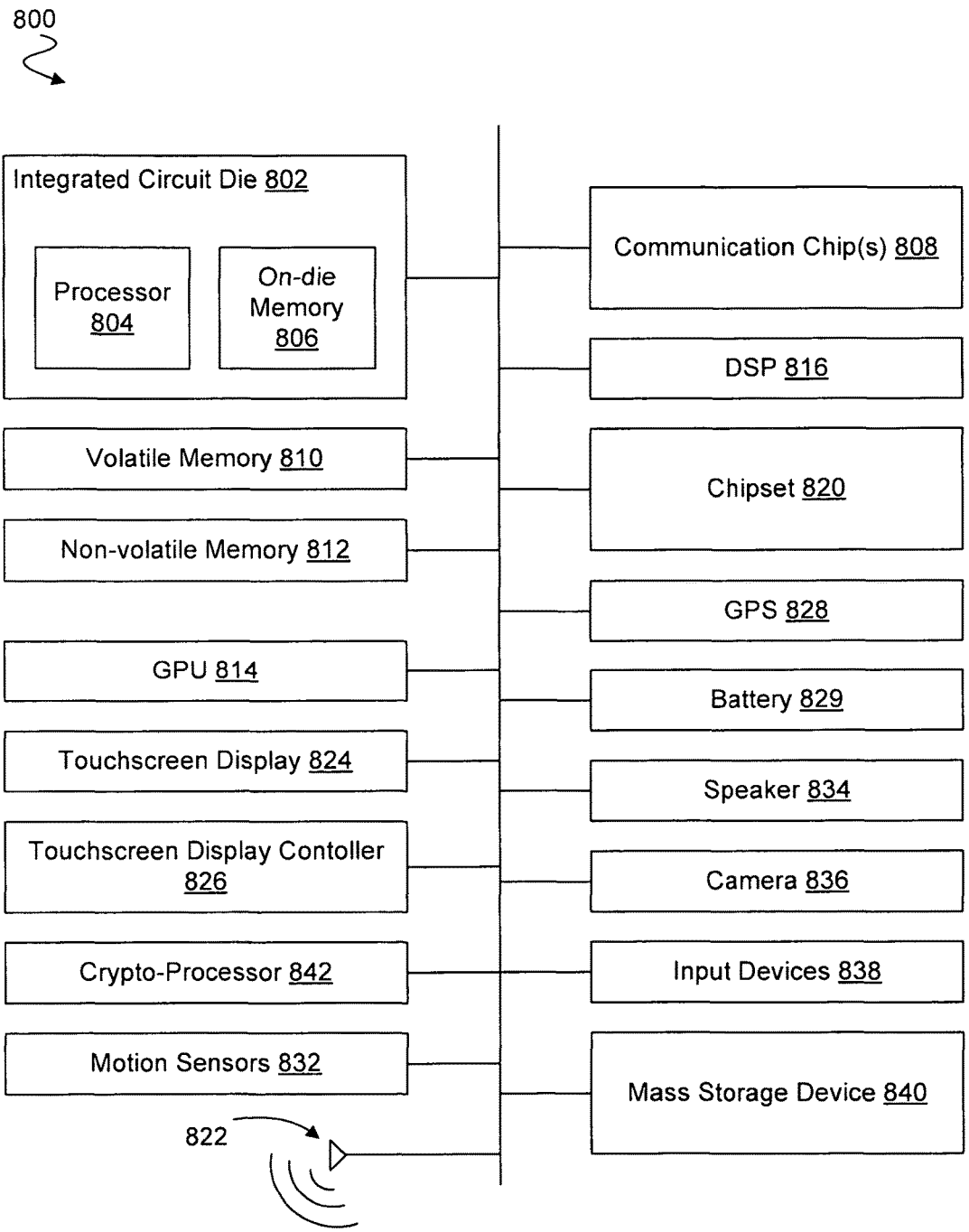
FIG. 8 is a high-level functional block diagram illustrating features of a computing device built in accordance with an embodiment.

FIG. 8 illustrates a computing device 800 in accordance with one embodiment. The computing device 800 may include a number of components. In one embodiment, these components are attached to one or more motherboards. In an alternate embodiment, these components are fabricated onto a single system-on-a-chip (SoC) die rather than a motherboard. The components in the computing device 800 include, but are not limited to, an integrated circuit die 802 and at least one communication chip 808. In some implementations the communication chip 808 is fabricated as part of the integrated circuit die 802. The integrated circuit die 802 may include a CPU 804 as well as on-die memory 806, often used as cache memory, that can be provided by technologies such as embedded DRAM (eDRAM) or spin-transfer torque memory (STTM or STTM-RAM).

Computing device 800 may include other components that may or may not be physically and electrically coupled to the motherboard or fabricated within an SoC die. These other components include, but are not limited to, volatile memory 810 (e.g., DRAM), non-volatile memory 812 (e.g., ROM or flash memory), a graphics processing unit 814 (GPU), a digital signal processor 816, a crypto processor 842 (a specialized processor that executes cryptographic algorithms within hardware), a chipset 820, an antenna 822, a display or a touchscreen display 824, a touchscreen controller 826, a battery 829 or other power source, a power amplifier (not shown), a global positioning system (GPS) device 828, a compass 830, a motion coprocessor or sensors 832 (that may include an accelerometer, a gyroscope, and a compass), a speaker 834, a camera 836, user input devices 838 (such as a keyboard, mouse, stylus, and touchpad), and a mass storage device 840 (such as hard disk drive, compact disk (CD), digital versatile disk (DVD), and so forth).

The communications chip 808 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 808 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 808. For instance, a first communication chip 808 may be dedicated to shorter range wireless communications such as Wi-Fi and Bluetooth and a second communication chip 808 may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory. In various embodiments, the computing device 800 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

In one implementation, a packaged device comprises a substrate including a first side and a second side opposite the first side, wherein contacts are disposed on the first side, and an integrated circuit (IC) chip disposed on the second side, the IC chip coupled to the contacts via the substrate. The packaged device further comprises a mold compound disposed at least partially around the IC chip, the mold compound comprising a suspension media and fibers disposed in the suspension media, wherein a spiral flow value of the mold compound is equal to or more than sixty five centimeters (65 cm), and wherein a modulus of elasticity of the mold compound is equal to or more than three GigePascals (3 GPa), the modulus of elasticity corresponding to a temperature equal to two hundred and sixty degrees Celsius (260° C.).

In one embodiment, the modulus of elasticity is equal to or more than 4 GPa. In another embodiment, the modulus of elasticity is equal to or more than 5 GPa. In another embodiment, the spiral flow value is equal to or more than 100 cm. In another embodiment, the spiral flow value is equal to or more than 130 cm. In another embodiment, the fibers comprise 35% or less of the mold compound by weight. In another embodiment, the fibers comprise 30% or less of the mold compound by weight. In another embodiment, the fibers comprise 20% or less of the mold compound by weight. In another embodiment, the fibers include glass fibers, carbon fibers or Kevlar fibers. In another embodiment, the fibers include glass fibers or Kevlar fibers.

In another implementation, a method comprises forming contacts on a first side of a substrate, coupling an integrated circuit (IC) chip to the contacts via a second side of the substrate, the second side opposite the first side, and, while the IC chip is coupled to the contacts, packaging the IC chip, including disposing mold compound at least partially around the IC chip, the mold compound including a suspension media and fibers disposed in the suspension media, wherein a spiral flow value of the mold compound is equal to or more than sixty five centimeters (65 cm), and wherein a modulus of elasticity of the mold compound is equal to or more than three GigePascals (3 GPa), the modulus of elasticity corresponding to a temperature equal to two hundred and sixty degrees Celsius (260° C.).

In one embodiment, the modulus of elasticity is equal to or more than 4 GPa. In another embodiment, the modulus of elasticity is equal to or more than 5 GPa. In another embodiment, the spiral flow value is equal to or more than 100 cm. In another embodiment, the spiral flow value is equal to or more than 130 cm. In another embodiment, the fibers comprise 35% or less of the mold compound by weight. In another embodiment, the fibers comprise 30% or less of the mold compound by weight. In another embodiment, the fibers comprise 20% or less of the mold compound by weight. In another embodiment, the fibers include glass fibers, carbon fibers or Kevlar fibers. In another embodiment, the fibers include glass fibers or Kevlar fibers.

In another implementation, a system comprises a packaged device including a substrate including a first side and a second side opposite the first side, wherein contacts are disposed on the first side, an integrated circuit (IC) chip disposed on the second side, the IC chip coupled to the contacts via the substrate, and a mold compound disposed at least partially around the IC chip, the mold compound comprising a suspension media and fibers disposed in the suspension media, wherein a spiral flow value of the mold compound is equal to or more than sixty five centimeters (65 cm), and wherein a modulus of elasticity of the mold compound is equal to or more than three GigePascals (3 GPa), the modulus of elasticity corresponding to a temperature equal to two hundred and sixty degrees Celsius (260° C.). The system further comprises a display device coupled to the packaged device, the display device to display an image based on signals exchanged with the IC chip.

In one embodiment, the modulus of elasticity is equal to or more than 4 GPa. In another embodiment, the modulus of elasticity is equal to or more than 5 GPa. In another embodiment, the spiral flow value is equal to or more than 100 cm. In another embodiment, the spiral flow value is equal to or more than 130 cm. In another embodiment, the fibers comprise 35% or less of the mold compound by weight. In another embodiment, the fibers comprise 30% or less of the mold compound by weight. In another embodiment, the fibers comprise 20% or less of the mold compound by weight. In another embodiment, the fibers include glass fibers, carbon fibers or Kevlar fibers. In another embodiment, the fibers include glass fibers or Kevlar fibers.

Techniques and architectures for packaging integrated circuitry are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A packaged device comprising:
   a substrate including a first side and a second side opposite the first side, wherein contacts are disposed on the first side;

an integrated circuit (IC) chip disposed on the second side, the IC chip coupled to the contacts via the substrate; and a mold compound disposed at least partially around the IC chip, the mold compound comprising a suspension media and fibers disposed in the suspension media, wherein a spiral flow value of the mold compound is equal to or more than sixty five centimeters (65 cm), and wherein a modulus of elasticity of the mold compound is equal to or more than three GigaPascals (3 GPa), the modulus of elasticity corresponding to a temperature equal to two hundred and sixty degrees Celsius (260° C.).

2. The packaged device of claim 1, wherein the modulus of elasticity is equal to or more than 4 GPa.

3. The packaged device of claim 2, wherein the modulus of elasticity is equal to or more than 5 GPa.

4. The packaged device of claim 1, wherein the spiral flow value is equal to or more than 100 cm.

5. The packaged device of claim 4, wherein the spiral flow value is equal to or more than 130 cm.

6. The packaged device of claim 1, wherein the fibers comprise 35% or less of the mold compound by weight.

7. The packaged device of claim 6, wherein the fibers comprise 30% or less of the mold compound by weight.

8. The packaged device of claim 7, wherein the fibers comprise 20% or less of the mold compound by weight.

9. The packaged device of claim 1, wherein the fibers include glass fibers, carbon fibers or Kevlar fibers.

10. The packaged device of claim 9, wherein the fibers include glass fibers or Kevlar fibers.

11. A method comprising:

forming contacts on a first side of a substrate;

coupling an integrated circuit (IC) chip to the contacts via a second side of the substrate, the second side opposite to the first side; and while the IC chip is coupled to the contacts, packaging the IC chip, including disposing mold compound at least partially around the IC chip, the mold compound including a suspension media and fibers disposed in the suspension media, wherein a spiral flow value of the mold compound is equal to or more than sixty five centimeters (65 cm), and wherein a modulus of elasticity of the mold compound is equal to or more than three GigaPascals (3 GPa), the modulus of elasticity corresponding to a temperature equal to two hundred and sixty degrees Celsius (260° C.).

12. The method of claim 11, wherein the modulus of elasticity is equal to or more than 4 GPa.

13. The method of claim 11, wherein the spiral flow value is equal to or more than 100 cm.

14. The method of claim 11, wherein the fibers comprise 35% or less of the mold compound by weight.

15. The method of claim 14, wherein the fibers comprise 30% or less of the mold compound by weight.

16. A system comprising:

a packaged device including:

a substrate including a first side and a second side opposite the first side, wherein contacts are disposed on the first side;

an integrated circuit (IC) chip disposed on the second side, the IC chip coupled to the contacts via the substrate; and a mold compound disposed at least partially around the IC chip, the mold compound comprising a suspension media and fibers disposed in the suspension media, wherein a spiral flow value of the mold compound is equal to or more than sixty five centimeters (65 cm), and wherein a modulus of elasticity of the mold compound is equal to or more than three GigaPascals (3 GPa), the modulus of elasticity corresponding to a temperature equal to two hundred and sixty degrees Celsius (260° C.); and a display device coupled to the packaged device, the display device to display an image based on signals exchanged with the IC chip.

17. The system of claim 16, wherein the modulus of elasticity is equal to or more than 4 GPa.

18. The system of claim 16, wherein the spiral flow value is equal to or more than 100 cm.

19. The system of claim 16, wherein the fibers include glass fibers, carbon fibers or Kevlar fibers.

20. The system of claim 19, wherein the fibers include glass fibers or Kevlar fibers.

* * * * *